United States Patent
Tsutsumi

(10) Patent No.: US 9,617,408 B2
(45) Date of Patent: Apr. 11, 2017

(54) RESIN COMPOSITION AND GATE INSULATING FILM

(71) Applicant: ZEON CORPORATION, Tokyo (JP)

(72) Inventor: Takashi Tsutsumi, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 14/907,037

(22) PCT Filed: Jul. 28, 2014

(86) PCT No.: PCT/JP2014/069787
§ 371 (c)(1),
(2) Date: Jan. 22, 2016

(87) PCT Pub. No.: WO2015/016164
PCT Pub. Date: Feb. 5, 2015

(65) Prior Publication Data
US 2016/0160012 A1    Jun. 9, 2016

(30) Foreign Application Priority Data

Jul. 31, 2013   (JP) ................................. 2013-158520

(51) Int. Cl.
| | |
|---|---|
| *C08L 29/04* | (2006.01) |
| *H01L 21/02* | (2006.01) |
| *C08L 5/00* | (2006.01) |
| *H01L 29/49* | (2006.01) |
| *C08K 5/21* | (2006.01) |
| *C08K 5/3445* | (2006.01) |

(52) U.S. Cl.
CPC ................ *C08L 29/04* (2013.01); *C08L 5/00* (2013.01); *H01L 21/02118* (2013.01); *H01L 29/4908* (2013.01); *C08K 5/21* (2013.01); *C08K 5/3445* (2013.01); *C08L 2203/20* (2013.01); *C08L 2205/03* (2013.01); *C08L 2312/04* (2013.01)

(58) Field of Classification Search
CPC ........ C08L 5/00; C08L 29/04; C08L 2203/20; C08L 2205/03; C08L 2312/04; H01L 29/4908; H01L 21/02118; C08K 5/21; C08K 5/3445
See application file for complete search history.

(56) References Cited

U.S. PATENT DOCUMENTS

2005/0249932 A1* 11/2005 Wang ..................... B32B 27/30
428/219

FOREIGN PATENT DOCUMENTS

| JP | 2010-56115 A | 3/2010 | |
|---|---|---|---|
| JP | 2010-067817 A | 3/2010 | |
| JP | 4914828 B2 * | 4/2012 | ........... H01L 21/312 |
| WO | 2006/104069 A1 | 10/2006 | |
| WO | 2009/133843 A1 | 11/2009 | |

OTHER PUBLICATIONS

International Search Report dated Oct. 28, 2014, issued in counterpart Application No. PCT/JP2014/069787 (1 page).

* cited by examiner

*Primary Examiner* — Robert Jones, Jr.
(74) *Attorney, Agent, or Firm* — Westerman, Hattori, Daniels & Adrian, LLP

(57) ABSTRACT

A resin composition containing a resin (A) which contains a hydroxyl group and a cyanoalkyl group, an epoxy compound (B) which has two or more epoxy groups in its molecule, a curing agent (C) which has two or more hydroxyl groups in its molecule and has a hydroxyl value of 150 to 300 mgKOH/g, and a cross-linking agent (D) which has a structure represented by the general formula (1).

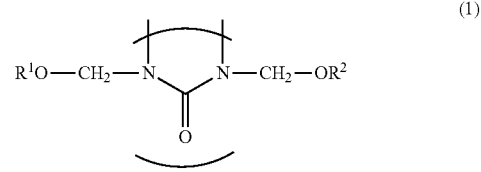

(In the general formula (1), $R^1$ and $R^2$ are $C_1$ to $C_{20}$ alkyl groups, where $R^1$ and $R^2$ may be the same as each other or different from each other.)

11 Claims, 7 Drawing Sheets

RESIN COMPOSITION AND GATE INSULATING FILM

TECHNICAL FIELD

The disclosure relates to a resin composition and gate insulating film, more particularly relates to a resin composition which gives a resin film which is high in dielectric constant, is excellent in chemical resistance and adhesion, and can suitably prevent a drop in adhesion even if treated at a high temperature after being formed and to a gate insulating film which is obtained using that resin composition.

BACKGROUND ART

In recent years, there has been active research conducted relating to TFTs (thin film transistors) obtained by using organic materials or amorphous oxides. Thin film transistors are transistors comprised of a substrate on which a semiconductor layer, gate electrode, source electrode, drain electrode, and gate insulating film are formed and are roughly divided into bottom gate types and top gate types. A bottom gate type is one which has a gate electrode on the substrate and has a source electrode and drain electrode connected by a semiconductor layer through a gate insulating film. On the other hand, a top gate type is one which has a source electrode and drain electrode adjoining a semiconductor layer on the substrate and has a gate electrode on that through the gate insulating film.

The gate insulating film forming part of such a thin film transistor is required to be excellent in insulating ability and electrical characteristics. A high dielectric constant gate insulating film enables a transistor to be driven at a low voltage and contributes to lower power consumption of the device. Further, for example, in the bottom gate type, when forming a semiconductor layer and a gate electrode and source electrode in predetermined shapes on the insulating film, for example, the photolithography method and the etching method are sometimes used. In this case, the gate insulating film is contacted by the developing solution and the etching solution, so the insulating film is required to have chemical resistance. In addition, such a formed gate insulating film is later formed with a semiconductor layer, gate electrode, and source electrode over it, but when forming the semiconductor layer, gate electrode, and source electrode, high temperature treatment is performed, so the gate insulating film is required to hold a high adhesion even after such high temperature treatment.

As the resin for forming such a gate insulating film, for example, Patent Document 1 discloses the art of using polyvinyl phenol (PVP) to form the gate insulating film. However, if using polyvinyl phenol like in this Patent Document 1, while it is possible to obtain a gate insulating film which is excellent in chemical resistance to a certain extent, there is the problem that the obtained gate insulating film is remarkably low in dielectric constant. Further, Non-Patent Document 1 discloses the art of forming a gate insulating film which is comprised of cyanoethyl pullulan and a cross-linking agent having a triazine ring, but such a gate insulating film remarkably falls in adhesion with the substrate if exposed to a high temperature after forming a film.

PRIOR ART DOCUMENTS

Patent Documents

Patent Document 1: Japanese Patent Publication No. 2010-56115A

Non-Patent Documents

Non-Patent Document 1: Organic Electronics 11 (2010), 996-1004

SUMMARY OF THE INVENTION

Technical Problem

The present invention relates to a resin composition which gives a resin film which is high in dielectric constant, is excellent in chemical resistance and adhesion, and can suitably prevent a drop in adhesion even if treated at a high temperature after being formed and to a gate insulating film which is obtained using that resin composition.

Solution to Problem

The present inventors engaged in intensive research for achieving the above object and as a result discovered that the above object can be achieved by a resin composition which is obtained by using a base resin constituted by a resin having hydroxyl groups and cyanoalkyl groups and by mixing into this a specific epoxy compound, a specific curing agent, and a cross-linking agent which has a specific alkoxymethyl group-containing structure.

That is, according to one aspect of the present invention, there are provided:

[1] A resin composition containing a resin (A) which contains a hydroxyl group and a cyanoalkyl group, an epoxy compound (B) which has two or more epoxy groups in its molecule, a curing agent (C) which has two or more hydroxyl groups in its molecule and has a hydroxyl value of 150 to 300 mgKOH/g, and a cross-linking agent (D) which has a structure represented by the following general formula (1).

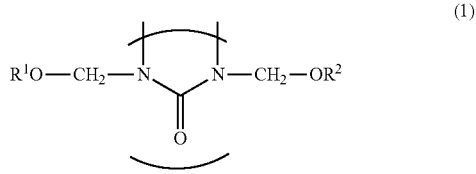

(In the general formula (1), $R^1$ and $R^2$ are $C_1$ to $C_{20}$ alkyl groups, where $R^1$ and $R^2$ may be the same as each other or different from each other.)

[2] The resin composition according to [1], wherein the resin (A) is one obtained by cyanoalkylating part of the hydroxyl groups which are contained in a hydroxyl group-containing organic compound.

[3] The resin composition according to [2], wherein the hydroxyl group-containing organic compound is pullulan or a polyvinyl alcohol.

[4] The resin composition according to any one of [1] to [3], wherein the epoxy compound (B) is an aromatic hydrocarbon structure-containing epoxy compound which has two or more epoxy groups in its molecule.

[5] The resin composition according to any one of [1] to [4], wherein the curing agent (C) has phenolic hydroxyl groups as the hydroxyl groups.
[6] The resin composition according to any one of [1] to [5], which further contains a phenol compound (E) which has a phenolic hydroxyl group in its molecule and which has a hydroxyl value of less than 150 mgKOH/g.
[7] The resin composition according to any one of [1] to [6], which further contains a curing catalyst (F).
[3] The resin composition according to any one of [1] to [7], wherein a ratio of the hydroxyl group and cyanoalkyl group which are contained in the resin (A) is, by molar ratio of "hydroxyl group:cyanoalkyl group", 50:50 to 2:98.
[9] The resin composition according to any one of claims 1 to 8, wherein the cross-linking agent (D) is at least one type of compound represented by the following general formulas (2) to (4).

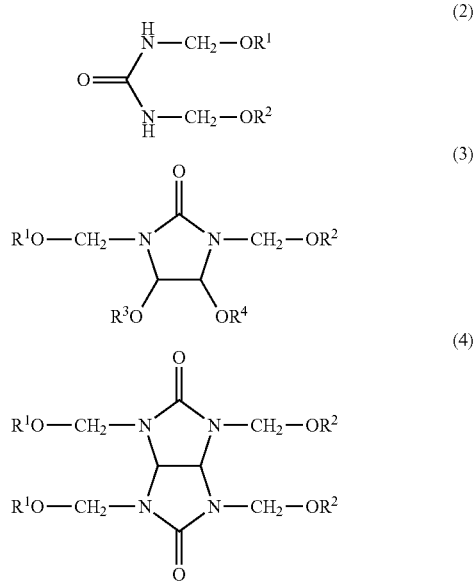

(In the general formulas (2) to (4), $R^1$ and $R^2$ are same as the general formula (1), in the general formula (3), $R^3$ and $R^4$ are $C_1$ to $C_{20}$ alkyl groups, and in which general formula (3), all or any of $R^1$, $R^2$, $R^3$, and $R^4$ may be the same as each other or different from each other.)

[10] A gate insulating film obtained using a resin composition according to any one of [1] to [9].

Advantageous Effects

According to one aspect of the present invention, it is possible to provide a resin composition which gives a resin film which is high in dielectric constant, is excellent in chemical resistance and adhesion, and can suitably prevent a drop in adhesion even if treated at a high temperature after being formed and a gate insulating film which is obtained using that resin composition.

DESCRIPTION OF EMBODIMENTS

Resin Composition

Figure 1:
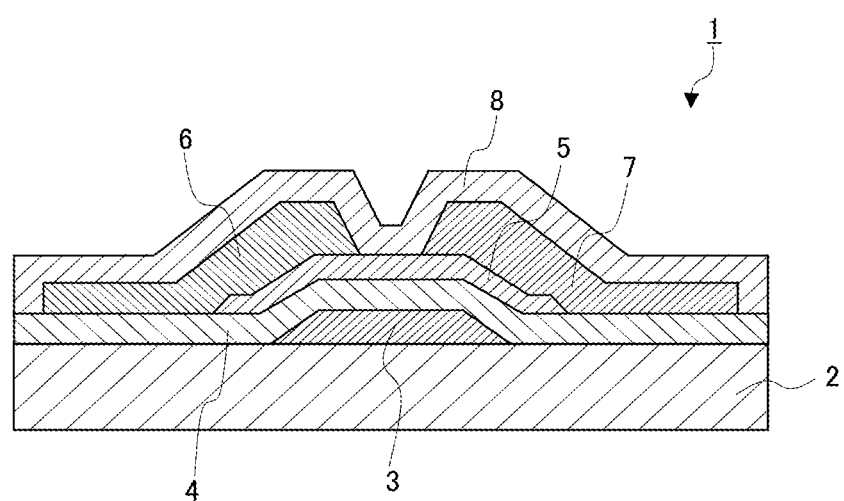
FIG. 1 is a cross-sectional view which shows one example of a thin film transistor which is provided with a gate insulating film comprised of the resin composition of an embodiment of the present invention.

The resin composition of one embodiment of the present invention contains a resin (A) which contains a hydroxyl group and a cyanoalkyl group, an epoxy compound (B) which has two or more epoxy groups in its molecule, a curing agent (C) which has two or more hydroxyl groups in its molecule and has a hydroxyl value of 150 to 300 mgKOH/g, and a cross-linking agent (D) which has a structure of the later explained general formula (1).

(Resin (A) which Contains Hydroxyl Group and Cyanoalkyl Group)

The resin (A) which contains a hydroxyl group and a cyanoalkyl group (below, referred to as the "hydroxyl group-cyanoalkyl group-containing resin (A)") is not particularly limited so long as a resin which contains a hydroxyl group and a cyanoalkyl group, but, for example, one which is obtained by using a hydroxyl group-containing organic compound which has a plurality of hydroxyl groups as a starting material and makes this react with acrylonitrile to thereby convert part of the hydroxyl groups which are contained in the hydroxyl group-containing organic compound to a cyanoalkyl etc. may be mentioned.

As the hydroxyl group-containing organic compound, for example, glucose, fructose, galactose, and other monosaccharides; maltose, sucrose, lactose, and other disaccharides; sorbitol, xylitol, and other sugar alcohols; cellulose, starch, pullulan, and other polysaccharides; methyl cellulose, carboxymethyl cellulose, and other alkyl celluloses; hydroxypropyl cellulose, hydroxyethyl cellulose, dihydroxypropyl cellulose, and other hydroxyalkyl celluloses; hydroxypropylmethyl cellulose, hydroxyethylmethyl cellulose, and other hydroxyalkylalkyl celluloses; dihydroxypropyl pullulan and other polysaccharide derivatives; polyvinyl alcohol; polyvinyl phenol; novolac resin; polyvinyl phenol; etc. may be mentioned.

Among these as well, from the viewpoint of the high effect of improvement of the dielectric constant in the case made into a gate insulating film, pullulan and polyvinyl alcohol are preferable.

Further, the cyanoalkyl group for substitution of the hydroxyl group-containing organic compound is not particularly limited, but a group of the general formula represented by —R—CN (where R is a $C_2$ to $C_6$ alkylene group) may be mentioned. For example, a cyanoethyl group, 1-cyanopropyl group, 1-cyanobutyl group, 1-cyanohexyl group, etc. may be mentioned. Among these as well, from the viewpoint of relatively easy introduction into the hydroxyl group-containing organic compound and high general applicability, a cyanoethyl group is preferable. Further, the hydroxyl group-cyanoalkyl group-containing resin (A) used in one embodiment of the present invention may be one having two or more types of cyanoalkyl groups. Note that, such a cyanoalkyl group can be introduced by using a corresponding cyano group-containing compound and reacting this with a hydroxyl group-containing organic compound. The cyanoalkylation rate can be calculated from the nitrogen content which is found by NMR or element analysis.

In the hydroxyl group-cyanoalkyl group-containing resin (A) used in one embodiment of the present invention, the ratio of the hydroxyl group and cyanoalkyl group is, by molar ratio of "hydroxyl group:cyanoalkyl group", preferably 50:50 to 2:98, more preferably 30:70 to 2:98, furthermore preferably 15:85 to 2:98. If the ratio of hydroxyl group is too low (the cyanoalkylation rate is too high), the obtained gate insulating film tends to fall in chemical resistance. On the other hand, if the ratio of hydroxyl group is too high (the cyanoalkylation rate is too low), the obtained gate insulating film tends to fall in dielectric constant.

(Epoxy Compound (B) which has Two or More Epoxy Groups in its Molecule)

The epoxy compound (B) which has two or more epoxy groups in its molecule (below, referred to simply as the "epoxy compound (B)") is not particularly limited so long as it is a compound which has two or more epoxy groups. Further, the epoxy groups may be terminal epoxy groups or alicyclic epoxy groups.

As such an epoxy compound (B), for example, a bisphenol A-type epoxy compound, bisphenol F-type epoxy compound, phenol novolac-type epoxy compound, cresol novolac-type epoxy compound, polyphenol-type epoxy compound, cyclic aliphatic epoxy compound, glycidyl ether compound, epoxy group-containing acrylate polymer, etc. may be mentioned. Among these as well, from the viewpoint of being able to further improve the obtained gate insulating film in dry etching resistance, an epoxy compound which has an aromatic hydrocarbon structure is preferable, while 2-[4-(2,3-epoxypropoxy)phenyl]-2-[4-[1,1-bis[4-([2,3-epoxypropoxy]phenyl)]ethyl]phenyl]propane, tetrakis(glycidyloxyphenyl)ethane, or an epoxy compound which has a naphthalene structure or fluorene structure is more preferable. Note that, these may be used as single type alone or may be jointly used as two types or more.

As specific examples of the epoxy compound (B) bisphenol A-type epoxy compound (product names "jER827, jER828, jER828EL, jER828XA, jER834, jER1001, jER1002, jER1003, jER1007, jER1009, jER1010, and jERYL980U" (above made by Mitsubishi Chemical Corporation)), bisphenol F-type epoxy compound (product names "jER806, jER806H, jER807, jER4004P, jER4005P, jER4007P, jER4010P, and jERYL983U" (above made by Mitsubishi Chemical Corporation)), epoxy compound which has naphthalene structure (product names "Epiclon HP4032, HP4032D, HP4700, HP4710, HP4770, HP5000" (above, made by DIC)), a biphenyldimethylene-type epoxy compound (product name "NC-3000", made by Nippon Kayaku), an aromatic amine-type epoxy compound (product name "H-434", made by Tohto Chemical Industry), a cresol novolac-type epoxy compound (product name "EOCN-1020", made by Nippon Kayaku), a phenol novolac type epoxy compound (product names "Epicoat 152 and 154" (above made by Mitsubishi Chemical Corporation)), a phenol aralkyl-type epoxy compound (product name "NC-2000", made by Nippon Kayaku), a bisphenol A novolac-type epoxy compound (product name "jER157S", made by Mitsubishi Chemical Corporation), 2-[4-(2,3-epoxypropoxy)phenyl]-2-[4-[1,1-bis[4-([2,3-epoxypropoxy]phenyl)]ethyl]phenyl]propane (product name "NC-6000", made by Nippon Kayaku), tetrakis(glycidyloxyphenyl)ethane (product name "jER1031S", made by Mitsubishi Chemical Corporation, "TEP-G", made by Asahi Organic Chemicals Industry), a dihydroanthracene-type epoxy compound (product name "XY8800", made by Mitsubishi Chemical Corporation), and other epoxy compounds which have aromatic hydrocarbon structures;

a trifunctional epoxy compound which has a dicyclopentadiene structure (product name "XD-1000", made by Nippon Kayaku), a 1,2-epoxy-4-(2-oxiranyl)cyclohexane adduct of 2,2-bis(hydroxymethyl) 1-butanol (15-functional alicyclic epoxy resin which has a cyclohexane structure and a terminal epoxy group, product name "EHPE3150", made by Daicel Chemical Industry), epoxylated 3-cyclohexene-1,2-dicarboxylic acid bis(3-cyclohexenylmethyl)-modified ε-caprolactone (aliphatic cyclic trifunctional epoxy resin, product name "Epolide GT301", made by Daicel Chemical Industry), epoxylated butanetetracarboxylic acid tetrakis(3-cyclohexenylmethyl)-modified ε-caprolactone (aliphatic cyclic tetrafunctional epoxy resin which has an alicyclic epoxy group, product name "Epolide GT401", made by Daicel Chemical Industry), chain alkyl polyfunctional epoxy compound (product name "SR-TMP", made by Sakamoto Yakuhin Kogyo Co., Ltd.), (3',4'-epoxycyclohexane)methyl-3,4-epoxy cyclohexanecarboxylate (product name "Celloxide 2021P", made by Daicel Chemical Industry), and other epoxy compounds which do not have aromatic hydrocarbon structures; etc. may be mentioned.

The content of the epoxy compound (B) in the resin composition of one embodiment of the present invention is preferably 1 to 100 parts by weight with respect to 100 parts by weight of the hydroxyl group-cyanoalkyl group-containing resin (A), more preferably 5 to 80 parts by weight, furthermore preferably 10 to 50 parts by weight. By making the content of the epoxy compound (B) the above range, the obtained gate insulating film can be suitably raised in chemical resistance and dry etching resistance.

(Curing Agent (C) which has Two or More Hydroxyl Groups in its Molecule and has Hydroxyl Value of 150 to 300 mgKOH/g)

The curing agent (C) which has two or more hydroxyl groups in its molecule and has a hydroxyl value of 150 to 300 mgKOH/g which is used in one embodiment of the present invention (below, referred to simply as the "curing agent (C)") is not particularly limited so long as a compound which has two or more hydroxyl groups, but a compound which has hydroxyl groups constituted by phenolic hydroxyl groups is preferable. By using a curing agent (C) constituted by a compound where the hydroxyl groups which react with the epoxy groups are phenolic hydroxyl groups, the obtained gate insulating film can be improved in dry etching resistance. The curing agent (C) reacts with the epoxy groups which are contained in the above-mentioned epoxy compound (B) by its hydroxyl groups and thereby acts as a curing agent with respect to the epoxy compound (B) and reacts with the alkoxymethyl groups which are contained in the later explained cross-linking agent (D) and thereby acts also as a curing agent with respect to the cross-linking agent (D).

The curing agent (C) is not particularly limited so long as a compound which has two or more hydroxyl groups in its molecule and which has a hydroxyl value of 150 to 300 mgKOH/g in range, but, for example, novolac-type phenol resins obtained by condensation or co-condensation of phenol, cresol, resorcine, catechol, bisphenol A, bisphenol F, phenylphenol, aminophenol, and other phenols and/or α-naphthol, β-naphthol, dihydroxynaphthalene, and other naphthols and formaldehyde, benzoaldehyde, salicylaldehyde, and other compounds which have aldehyde groups in the presence of an acidic catalyst, a phenol-aralkyl resin, biphenylene-type phenol-aralkyl resin, naphthol-aralkyl resin, and other aralkyl-type phenol resins which are synthesized of phenols and/or naphthols and dimethoxyparaxylene or bis(methoxyethyl)biphenyl, dicyclopentadiene-type phenol novolac resin, dicyclopentadiene-type naphthol novolac resin, and other dicyclopentadiene-type phenol resins which are synthesized by copolymerization of phenols and/or naphthols and dicyclopentadiene, a triphenylmethane-type phenol resin, terpene-modified phenol resin, p-xylene- and/or m-xylene-modified phenol resin, melamine-modified phenol resin, cyclopentadiene-modified phenol resin, biphenyl type phenol resin, phenol resins which are obtained by copolymerization of two or more of these, etc. may be mentioned. These may be used alone or may be used as two types or more combined.

Further, the curing agent (C) may be a compound which has a hydroxyl value of 150 to 300 mgKOH/g in range, but the hydroxyl value is preferably 160 to 250 mgKOH/g, more preferably 175 to 220 mgKOH/g.

In the resin composition of one embodiment of the present invention, the content of the curing agent (C) is preferably 1 to 100 parts by weight with respect to 100 parts by weight of the hydroxyl group-cyanoalkyl group-containing resin (A), more preferably 3 to 80 parts by weight, furthermore preferably 5 to 50 parts by weight. By making the content of the curing agent (C) the above range, the obtained gate insulating film can be made more suitable in strength.

(Cross-Linking Agent (D) which has Structure of General Formula (1))

The resin composition of one embodiment of the present invention, in addition to the above-mentioned hydroxyl group-cyanoalkyl group-containing resin (A), epoxy compound (B), and curing agent (C), a cross-linking agent (D) which has a structure of the following general formula (1) (below, referred to as the "cross-linking agent (D)").

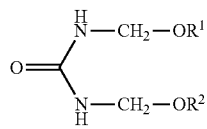
(1)

In the above general formula (1), $R^1$ and $R^2$ are $C_1$ to $C_{20}$ alkyl groups. From the viewpoint of the solubility with respect to the above-mentioned hydroxyl group-cyanoalkyl group-containing resin (A), $C_1$ to $C_{10}$ alkyl groups are preferable, while $C_1$ to $C_3$ alkyl groups are more preferable. Note that, $R^1$ and $R^2$ may be the same or different from each other.

The cross-linking agent (D) used in one embodiment of the present invention is not particularly limited so long as one which has the structure which is shown in the above general formula (1), but, for example, compounds which are shown in the following general formulas (2) to (4) are preferable.

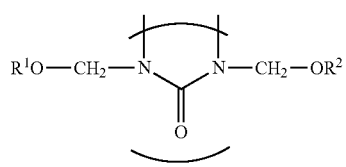
(2)

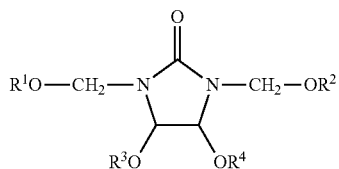
(3)

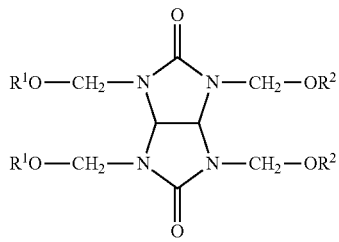
(4)

(In the general formulas (2) to 4), $R^1$ and $R^2$ are same as the above general formula (1), while in which general formula (3) $R^3$ and $R^4$ are $C_1$ to $C_{20}$ alkyl groups, preferably $C_1$ to $C_{10}$ alkyl groups, more preferably $C_1$ to $C_3$ alkyl groups. Further, in the general formula (3), $R^1$, $R^2$, $R^3$, and $R^4$ may all or partially be the same as each other or may all be different from each other.)

Further, as specific examples of the cross-linking agent (D) used in the embodiment of the present invention, the compounds of the following formulas (5) to (10) may be mentioned. Among these as well, from the viewpoint of the actions and effects of the present invention becoming more remarkable, compounds of the following formulas (7) and (9) are preferable, while compounds of the following formula (9) are more preferable.

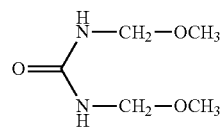
(5)

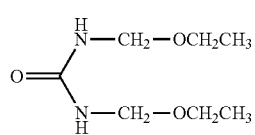
(6)

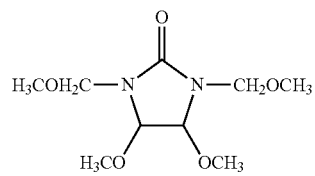
(7)

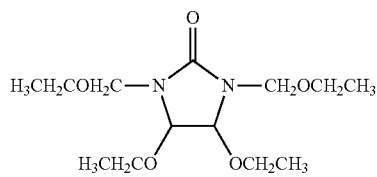
(8)

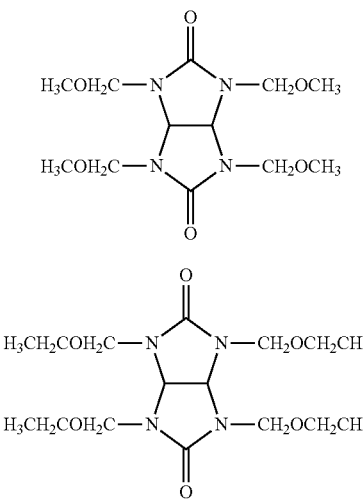

(9)

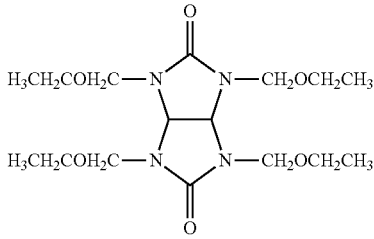

(10)

In the resin composition of one embodiment of the present invention, the content of the cross-linking agent (D) is preferably 0.1 to 100 parts by weight with respect to 100 parts by weight of the hydroxyl group-cyanoalkyl group-containing resin (A), more preferably 1 to 50 parts by weight, furthermore preferably 5 to 20 parts by weight. By making the content of the cross-linking agent (D) the above range, the obtained gate insulating film can be further raised in chemical resistance and adhesion and further in adhesion when treated at a high temperature after film formation.

(Phenol Compound (E))

Further, the resin composition of one embodiment of the present invention may contain, in addition to the above-mentioned components, a phenol compound (E) which contains a phenolic hydroxyl group in its molecule and which has a hydroxyl value of less than 150 mgKOH/g (below, simply referred to as "phenol compound (E)"). By further containing the phenol compound (E) which has a hydroxyl value of less than 150 mgKOH/g, it is possible to suppress a drop in adhesion due to baking after film formation while further raising the chemical resistance.

The phenol compound (E) used in one embodiment of the present invention is not particularly limited so long as one having a phenolic hydroxyl group in its molecule and having a hydroxyl value of less than 150 mgKOH/g, but, for example, novolac-type phenol resins obtained by condensation or co-condensation of phenol, cresol, resorcine, catechol, bisphenol A, bisphenol F, phenylphenol, aminophenol, and other phenols and/or α-naphthol, β-naphthol, dihydroxynaphthalene, and other naphthols and formaldehyde, benzoaldehyde, salicylaldehyde, and other compounds which have aldehyde groups in the presence of an acidic catalyst, a phenol-aralkyl resin, biphenylene-type phenol-aralkyl resin, naphthol-aralkyl resin, and other aralkyl-type phenol resins which are synthesized of phenols and/or naphthols and dimethoxyparaxylene or bis(methoxymethyl)biphenyl, dicyclopentadiene-type phenol novolac resin, dicyclopentadiene-type naphthol novolac resin, and other dicyclopentadiene-type phenol resins which are synthesized by copolymerization of phenols and/or naphthols and dicyclopentadiene, a triphenylmethane-type phenol resin, terpene-modified phenol resin, p-xylene- and/or m-xylene-modified phenol resin, melamine-modified phenol resin, cyclopentadiene-modified phenol resin, biphenyl type phenol resin, phenol resins which are obtained by copolymerization of two or more of these, etc. may be mentioned. These may be used alone or may be used as two types or more combined.

Further, the phenol compound (E) may be a compound which has a hydroxyl value of less than 150 mgKOH/g, but the hydroxyl value is preferably 50 to 140 mgKOH/g, more preferably 80 to 120 mgKOH/g.

In the resin composition of one embodiment of the present invention, the content of the phenol compound (E) is preferably 0.1 to 100 parts by weight with respect to 100 parts by weight of the hydroxyl group-cyanoalkyl group-containing resin (A), more preferably 1 to 50 parts by weight, furthermore preferably 5 to 20 parts by weight. By making the content of the phenol compound (E) the above range, the effect of addition can be further raised. Further, the content of the phenol compound (E) is, by the total with the above-mentioned curing agent (C) (that is, the total amount of the phenol compound (E) and the curing agent (C)), preferably made an amount of 1 to 100 parts by weight in range with respect to 100 parts by weight of the hydroxyl group-cyanoalkyl group-containing resin (A), more preferably 5 to 50 parts by weight, furthermore preferably 10 to 40 parts by weight. By making the total amount of the phenol compound (E) and curing agent (C) the above range, the obtained gate insulating film can be further improved in chemical resistance and adhesion and, further, adhesion when treated at a high temperature after film formation. The phenol compound (E), like the curing agent (C), reacts with the epoxy groups which are contained in the above-mentioned epoxy compound (B) by its hydroxyl group and thereby acts as a curing agent with respect to the epoxy compound (B) and reacts with the alkoxymethyl groups which are contained in the later explained cross-linking agent (D) and thereby acts also as a curing agent with respect to the cross-linking agent (D).

(Curing Catalyst (F))

Further, the resin composition of one embodiment of the present invention may contain a curing catalyst (F) in addition to the above components. As the curing catalyst (F), for example, a compound which has an acidic group or latent acidic group, a compound which has a basic group or latent basic group, etc. may be mentioned. The compound which has an acidic group or latent acidic group is not particularly limited so long as having an acidic group or latent acidic group which produces an acid by heating or light, but is preferably an aliphatic compound, aromatic compound, or heterocyclic compound, furthermore preferably an aromatic compound or heterocyclic compound. The compound which has a basic group or latent basic group is not particularly limited so long as having a basic group or latent basic group which produces a basic group by heating, but is preferably an aliphatic compound, aromatic compound, or heterocyclic compound, furthermore preferably an aromatic compound or heterocyclic compound. By including the curing catalyst (F), the heating energy (heating time and heating temperature) which is required for curing when curing the resin composition of the embodiment of the present invention can be reduced.

The number of acidic groups of the compound which has an acidic group is not particularly limited, but a compound which has a total of two or more acidic groups is preferable. The acidic groups may be the same as or different from each other.

The acidic group may be an acidic functional group. As specific examples, a sulfonic acid group, phosphoric acid group, and other strong acidic groups; a carboxyl group, thiol group, carboxymethylenethio groups, and other weak acidic groups; may be mentioned. Among these as well, a carboxyl group, thiol group, or carboxymethylenethio group is preferable, while a carboxyl group is particularly preferable. Further, among these acidic groups as well, one in which the acid dissociation constant pKa is 3.5 to 5.0 in range is preferable. Note that, when there are two or more acidic groups, the first dissociation constant pKa1 is made the acid dissociation constant and one in which the first dissociation constant pKa1 is in the above range is preferable. Further, pKa is found in accordance with pKa=−log Ka by measurement of the acid dissociation constant Ka=$[H_3O^+][B^-]/[BH]$ under a dilute aqueous solution conditions. Here, BH indicates an organic acid, while $B^-$ indicates a conjugate base of an organic acid.

Note that, the method of measurement of pKa can, for example, be use of a pH meter for measurement of the concentration of hydrogen ions and calculation from the concentration of the substance and the concentration of the hydrogen ions.

Furthermore, the compound which has an acidic group or latent acidic group may have a substituent other than an acidic group and latent acidic group.

As this substituent, an alkyl group, aryl group, and other hydrocarbon groups and in addition a halogen atom; alkoxy group, aryloxy group, acyloxy group, heterocyclic oxy group; amino group, acylamino group, ureido group, sulfamoylamino group, alkoxycarbonylamino group, or aryloxycarbonylamino group substituted by an alkyl group, aryl group or heterocyclic group; alkylthio group, arylthio group, heterocyclic thio group; and other polar groups not having a proton, hydrocarbon groups which are substituted by these polar groups not having a proton, etc. may be mentioned.

As specific examples of compounds which have acidic groups among the compounds which have such acidic groups or latent acidic groups, methane acid, ethane acid, propane acid, butane acid, pentane acid, hexane acid, heptane acid, octane acid, nonane acid, decane acid, glycol acid, glycerin acid, ethane diacid (also called "oxalic acid"), propane diacid (also called "malonic acid"), butane diacid (also called "succinic acid"), pentane diacid, hexane diacid (also called "adipic acid"), 1,2cyclohexanedicarboxylic acid, 2-oxopropane acid, 2-hydroxybutane diacid, 2-hydroxypropane tricarboxylic acid, mercaptosuccinic acid, dimercaptosuccinic acid, 2,3-dimercapto-1-propanol, 1,2,3-trimercaptopropane, 2,3,4-trimercapto-1-butanol, 2,4-dimercapto-1,3-butanediol, 1,3,4-trimercapto-2-butanol, 3,4-dimercapto-1,2-butanediol, 1,5-dimercapto-3-thiapentane, and other aliphatic compounds;

benzoic acid, p-hydroxybenzenecarboxylic acid, o-hydroxybenzenecarboxylic acid, 2-naphthalenecarboxylic acid, methylbenzoic acid, dimethylbenzoic acid, trimethylbenzoic acid, 3-phenylpropane acid, dihydroxybenzoic acid, dimethoxybenzoic acid, benzene-1,2-dicarboxylic acid (also referred to as "phthalic acid"), benzene-1,3-dicarboxylic acid (also referred to as "isophthalic acid"), benzene-1,4-dicarboxylic acid (also referred to as "terephthalic acid"), benzene-1,2,3-tricarboxylic acid, benzene-1,2,4-tricarboxylic acid, benzene-1,3,5-tricarboxylic acid, benzenehexacarboxylic acid, biphenyl-2,2'-dicarboxylic acid, 2-(carboxymethyl)benzoic acid, 3-(carboxymethyl)benzoic acid, 4-(carboxymethyl)benzoic acid, 2-(carboxycarbonyl)benzoic acid, 3-(carboxycarbonyl)benzoic acid, 4-(carboxycarbonyl)benzoic acid, 2-mercaptobenzoic acid, 4-mercaptobenzoic acid, diphenol acid, 2-mercapto-6-naphthalenecarboxylic acid, 2-mercapto-7-naphthalenecarboxylic acid, 1,2-dimercaptobenzene, 1,3-dimercaptobenzene, 1,4-dimercaptobenzene, 1,4-naphthalenedithiol, 1,5-naphthalenedithiol, 2,6-naphthalenedithiol, 2,7-naphthalenedithiol, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(mercaptoethyl)benzene, 1,2,4-tris(mercaptoethyl)benzene, 1,3,5-tris(mercaptoethyl)benzene, and other aromatic compound;

nicotinic acid, isonicotinic acid, 2-furoic acid, pyrrole-2,3-dicarboxylic acid, pyrrole-2,4-dicarboxylic acid, pyrrole-2,5-dicarboxylic acid, pyrrole-3,4-dicarboxylic acid, imidazole-2,4-dicarboxylic acid, imidazole-2,5-dicarboxylic acid, imidazole-4,5-dicarboxylic acid, pyrazole-3,4-dicarboxylic acid, pyrazole-3,5-dicarboxylic acid, or other five-member heterocyclic compound which contains nitrogen atoms; thiophen-2,3-dicarboxylic acid, thiophen-2,4-dicarboxylic acid, thiophen-2,5-dicarboxylic acid, thiophen-3,4-dicarboxylic acid, thiazole-2,4-dicarboxylic acid, thiazole-2,5-dicarboxylic acid, thiazole-4,5-dicarboxylic acid, isothiazole-3,4-dicarboxylic acid, isothiazole-3,5-dicarboxylic acid, 1,2,4-thiadiazole-2,5-dicarboxylic acid, 1,3,4-thiadiazole-2,5-dicarboxylic acid, 3-amino-5-mercapto-1,2,4-thiadiazole, 2-amino-5-mercapto-1,3,4-thiadiazole, 3,5-dimercapto-1,2,4-thiadiazole, 2,5-dimercapto-1,3,4-thiadiazole, 3-(5-mercapto-1,2,4-thiadiazol-3-ylsulfanyl)succinic acid, 2-(5-mercapto-1,3,4-thiadiazol-2-ylsulfanyl)succinic acid, (5-mercapto-1,2,4-thiadiazol-3-ylthio)acetic acid, (5-mercapto-1,3,4-thiadiazol-2-ylthio)acetic acid, 3-(5-mercapto-1,2,4-thiadiazol-3-ylthio)propionic acid, 2-(5-mercapto-1,3,4-thiadiazol-2-ylthio)propionic acid, 3-(5-mercapto-1,2,4-thiadiazol-3-ylthio)succinic acid, 2-(5-mercapto-1,3,4-thiadiazol-2-ylthio)succinic acid, 4-(3-mercapto-1,2,4-thiadiazol-5-yl)thiobutanesulfonic acid, 4-(2-mercapto-1,3,4-thiadiazol-5-yl)thiobutanesulfonic acid, and other five-member heterocyclic compounds which include nitrogen atoms and sulfur atoms;

pyridine-2,3-dicarboxylic acid, pyridine-2,4-dicarboxylic acid, pyridine-2,5-dicarboxylic acid, pyridine-2,6-dicarboxylic acid, pyridine-3,4-dicarboxylic acid, pyridine-3,5-dicarboxylic acid, pyridazine-3,4-dicarboxylic acid, pyridazine-3,5-dicarboxylic acid, pyridazine-3,6-dicarboxylic acid, pyridazine-4,5-dicarboxylic acid, pyrimidine-2,4-dicarboxylic acid, pyrimidine-2,5-dicarboxylic acid, pyrimidine-4,5-dicarboxylic acid, pyrimidine-4,6-dicarboxylic acid, pyridine-2,3-dicarboxylic acid, pyradine-2,5-dicarboxylic acid, pyridine-2,6-dicarboxylic acid, triazine-2,4-dicarboxylic acid, 2-diethylamino-4,6-dimercapto-s-triazine, 2-dipropylamino-4,6-dimercapto-s-triazine, 2-dibutylamino-4,6-dimercapto-s-triazine, 2-anilino-4,6-dimercapto-s-triazine, 2,4,6-trimercapto-s-triazine, and other six-member heterocyclic compounds which include nitrogen atoms may be mentioned.

The latent acidic group may be a group which produces an acidic functional group by photoirradiation or heating. As specific examples, a sulfonium salt group, benzothiazolium salt group, ammonium salt group, phosphonium salt group, iodonium salt, block carboxylic acid group, etc. may be mentioned, among these as well, a sulfonium salt group is preferable, for example, a hexafluorophosphorus- or hexafluoroantimony-based sulfonium salt group can be used. As a compound which has such sulfonium salt group, for example, the San-aid SI series (100L, 110L, 150, 180L, made by Sanshin Chemical Industry) etc. may be used.

The basic group may be a basic functional group. As specific examples, an amino group or a nitrogen-containing heterocyclic ring may be mentioned. As amino group-containing compounds, hexamethylenediamine and other aliphatic polyamines; 4,4'-diaminodiphenyl ether, diaminodiphenyl sulfone, and other aromatic polyamines may be mentioned. As nitrogen-containing heterocyclic compounds, 2-methylimidazole (product name: 2MZ), 4-methyl-2-ethylimidazole (product name: 2E4MZ), 2-phenylimidazole (product name: 2PZ), 4-methyl-2-phenylimidazole (product name: 2P4MZ), 1-benzyl-2-methylimidazole (product name: 1B2MZ) 2-ethylimidazole (product name: 2EZ), 2-isopropylimidazole (product name: 2IZ), 1-cyanoethyl-2-methylimidazole (product name: 2MZ-CN), 1-cyanoethyl-2-ethyl-4-methylimidazole (product name: 2E4MZ-CN) 1-cyanoethyl-2-undecylimidazole (product name: C11Z-CN), etc. may be mentioned.

The compound which has a latent basic group may be a compound which produces a basic functional group by photoirradiation or heating. As specific examples, WPBG-018, WPBG-027, WPBG-082, WPBG-140 (above, made by Wako Pure Chemical Industries), etc. may be mentioned.

In the resin composition of one embodiment of the present invention, the content of the curing catalyst (F) is preferably 0.01 to 50 parts by weight with respect to 100 parts by weight of the hydroxyl group-cyanoalkyl group-containing resin (A), more preferably 0.1 to 20 parts by weight, furthermore preferably 1 to 10 parts by weight. By making the content of the curing catalyst (F) the above range, the heat energy which is required for curing when curing the resin composition can be effectively decreased and due to this the manufacturing cost can be decreased.

(Other Compounding Agents)

The resin composition of one embodiment of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, and other linear ketones; n-propyl alcohol, isopropyl alcohol, n-butyl alcohol, cyclohexanol, and other alcohols; ethyleneglycol dimethyl ether, ethyleneglycol diethyl ether, dioxane, and other ethers; ethyleneglycol monomethyl ether, ethyleneglycol monoethyl ether, and other alcohol ethers; propyl formate, butyl formate, propyl acetate, butyl acetate, methyl propionate, ethyl propionate, methyl butyrate, ethyl butyrate, methyl lactate, ethyl lactate, and other esters; cellosolve acetate, methyl cellosolve acetate, ethyl cellosolve acetate, propylcellusolve acetate, butylcellosolve acetate, and other cellosolve esters; propyleneglycol, propyleneglycol monomethylether, propyleneglycol monomethylether acetate, propyleneglycol monoethylether acetate, propyleneglycol monobutylether, and other propyleneglycols; diethyleneglycol monomethylether, diethyleneglycol monoethylether, diethyleneglycol dimethylether, diethyleneglycol diethylether, diethyleneglycol methylethylether, and other diethyleneglycols; γ-butyrolactone, γ-valerolactone, γ-caprolactone, γ-caprylolactone, and other saturated γ-lactones; trichloroethylene and other halogenated hydrocarbons; toluene, xylene, and other aromatic hydrocarbons; dimethylacetoamide, dimethylformamide, N-methylacetoamide, and other polar solvents etc. may be mentioned. These solvents may be used alone or as two types or more combined. The content of the solvent is preferably 10 to 10000 parts by weight with respect to 100 parts by weight of the hydroxyl group-cyanoalkyl group-containing resin (A), more preferably 50 to 5000 parts by weight, furthermore preferably 100 to 1000 parts by weight in range. Note that, when the resin composition is made to contain a solvent, the solvent is usually removed after forming the gate insulating film.

Further, the resin composition of one embodiment of the present invention may contain, within a range in which the effect of one embodiment of the present invention is not impaired, as desired, an antioxidant, surfactant, coupling agent or its derivative, sensitizer, light stabilizer, defoamer, pigment, dye, filler, and other compounding agents etc. Among these, for example, as the coupling agent or its derivative, sensitizer, and light stabilizer, the ones described in Japanese Patent Publication No. 2011-75609A etc. can be used.

The antioxidant is not particularly limited, but, for example, a phenol-based antioxidant, phosphorus-based antioxidant, sulfur-based antioxidant, amine-based antioxidant, lactone-based antioxidant, etc. which is used for a usual polymer can be used. By including an antioxidant, the obtained gate insulating film can be improved in light resistance and heat resistance.

As the phenol-based antioxidant, a conventionally known one can be used. For example, 2-t-butyl-6-(3-t-butyl-2-hydroxy-5-methylbenzyl)-4-methylphenylacrylate, 2,4-di-t-amyl-6-[1-(3,5-di-t-amyl-2-hydroxyphenyl)ethyl]phenylacrylate, or other acrylate-based compound described in Japanese Patent Publication No. 63-179953A or Japanese Patent Publication No. 1-168643A; 2,6-di-t-butyl-4-methylphenol, 2,6-di-t-butyl-4-ethylphenol, octadecyl-3-(3,5-di-t-butyl-4-hydroxyphenyl)propionate, 2,2'-methylene-bis(4-methyl-6-t-butylphenol), 4,4'-butylidene-bis(6-t-butyl-m-cresol), 4,4'-thiobis(3-methyl-6-t-butylphenol), bis(3-cyclohexyl-2-hydroxy-5-methylphenyl)methane, 3,9-bis[2-[3-(3-t-butyl-4-hydroxy-5-methylphenyl)propionyloxy]-1,1-dimethylethyl]-2,4,8,10-tetraoxaspiro[5,5]undecane, 1,1,3-tris(2-methyl-4-hydroxy-5-t-butylphenyl)butane, pentaerythritol-tetrakis[3-(3,5-di-tert-butyl-4-hydroxyphenyl)propionate], triethylene glycol bis[3-(3-t-butyl-4-hydroxy-5-methylphenyl)propionate], tocopherol, or other alkyl-substituted phenol-based compound; 6-(4-hydroxy-3,5-di-t-butylanilino)-2,4-bis-octylthio-1,3,5-triazine, 6-(4-hydroxy-3,5-dimethylanilino)-2,4-bis-octyithio-1,3,5-triazine, 6-(4-hydroxy-3-methyl-5-t-butylanilino)-2,4-bis-octylthio-1,3,5-triazine, 2-octylthio-4,6-bis-(3,5-di-t-butyl-4-oxyanilino)-1,3,5-triazine, or other triazine group-containing phenol-based compound; etc. can be used.

The phosphorus-based antioxidant is not particularly limited so long as one normally used in the general resin industry. For example, triphenyl phosphite, diphenylisodecyl phosphite, phenyldiisodecyl phosphite, tris(nonylphenyl)phosphite, tris(dinonylphenyl)phosphite, tris(2,4-di-t-butylphenyl)phosphite, tris(2-t-butyl-4-methylphenyl)phosphite, tris(cyclohexylphenyl)phosphite, 2,2'-methylenebis(4,6-di-t-butylphenyl)octyl phosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-disiloxy-9,10-dihydro-9-oxa-10-phosphaphenanthrene, or other monophosphite-based compound; 4,4'-butylidene-bis(3-methyl-6-t-butylphenyl-di-tridecylphosphite), 4,4'-isopropylidene-bis[phenyl-di-alkyl ($C_{12}$ to $C_{15}$)phosphite], 4,4'-isopropylidene-bis[diphenylmonoalkyl ($C_{12}$ to $C_{15}$) phosphite], 1,1,3-tris(2-methyl-4-di-tridecylphosphite-5-t-butylphenyl)butane, tetrakis(2,4-di-t-butylphenyl)-4,4'-biphenylene diphosphite, cyclic neopentanetetrayl bis (octadecylphosphite), cyclic neopentanetetrayl bis (isodecylphosphite), cyclic neopentanetetrayl bis (nonylphenyl phosphite), cyclic neopentanetetrayl bis(2,4-di-t-butylphenylphosphite), cyclic neopentanetetrayl bis(2,4-dimethylphenylphosphite), cyclic neopentanetetrayl bis(2,6-di-t-butylphenylphosphite), or other diphosphite-based compounds etc. can be used. Among these as well, monophosphite-based compounds are preferable, tris(nonylphenyl)phosphite, tris(dinonylphenyl)phosphite, tris(2,4-di-t-butylphenyl)phosphite, etc. are particularly preferable.

As sulfur-based antioxidants, for example, dilauryl 3,3'-thiodipropionate, dimyristyl 3,3'-thiodipropionate, distearyl 3,3'-thiodipropionate, laurylstearyl 3,3'-thiodipropionate, pentaerythritol-tetrakis-(β-lauryl-thiopropionate), 3,9-bis(2-dodecylthioethyl)-2,4,8,10-tetraoxaspiro[5,5]undecane, etc. can be used.

These antioxidants can be used respectively alone or as two or more types combined.

In the resin composition of one embodiment of the present invention, the content of the antioxidant is preferably 0.1 to 10 parts by weight with respect to 100 parts by weight of the hydroxyl group-cyanoalkyl group-containing resin (A), more preferably 1 to 5 parts by weight. If the content of the antioxidant is in the above range, the obtained gate insulating film can be made excellent in light resistance and heat resistance.

The surfactant is used for a purpose such as preventing striation. As the surfactant, for example, a silicone-based surfactant, fluorine-based surfactant, polyoxyalkylene-based surfactant, methacrylic acid copolymer-based surfactant, acrylic acid copolymer-based surfactant, etc. may be mentioned.

As the silicone-based surfactant, for example, product names "SH28PA, SH29PA, SH30PA, ST80PA, ST83PA, ST86PA, SF8416, SH203, SH230, SF8419, SF8422, FS1265, SH510, SH550, SH710, SH8400, SF8410, SH8700, and SF8427" (above, made by Toray Dow Corning), product names "KP-321, KP-323, KP-324, KP-340, and KP-341" (above made by ShinEtsu Chemical), product names "TSF400, TSF401, TSF410, TSF4440, TSF4445, TSF4450, TSF4446, TSF4452, and TSF4460" (above, made by Momentive Performance Materials Japan.), product names "BYK300, BYK301, BYK302, BYK306, BYK307, BYK310, BYK315, BYK320, BYK322, BYK323, BYK331, BYK333, BYK370, BYK375, BYK377, and BYK378" (above, made by BYE Chemie Japan), etc. may be mentioned.

As the fluorine-based surfactant, for example, Fluorinert "FC-430, FC-431" (above made by Sumitomo 3M), Surflon "S-141, S-145, S-381, and S-393" (above made by Asahi Glass), EFTOP "EF301, EF303, EF351, EF352" (above made by JEMCO), Megafac "F171, F172, F173, R-30" (above made by DIC) etc. may be mentioned.

As the polyoxyalkylene-based surfactant, for example, polyoxyethylenelauryl ether, polyoxyethylenestearyl ether, polyoxyethyleneoleyl ether, polyoxyethyleneoctylphenyl ether, polyoxyethylenenonylphenyl ether, and other polyoxyethylenealkyl ethers, polyethyleneglycol dilaurate, polyethyleneglycol stearate, and other polyoxyethylene dialkyl esters, etc. may be mentioned.

These surfactants can be respectively used alone or as two or more types combined.

In the resin composition of one embodiment of the present invention, the content of the surfactant is preferably 0.01 to 0.5 part by weight with respect to 100 parts by weight of the hydroxyl group-cyanoalkyl group-containing resin (A), more preferably 0.02 to 0.2 part by weight. If the content of the surfactant is in the above range, the effect of prevention of striation can be further improved.

The method of preparation of the resin composition of one embodiment of the present invention is not particularly limited, but it is sufficient to mix the components which form the resin composition by known methods.

The method of mixing is not particularly limited, but it is preferable to dissolve or disperse the components which form the resin composition in solvents and mix the solutions or dispersions. Due to this, the resin composition is obtained in the form of a solution or dispersion.

The method of dissolving or dispersing the components which form the resin composition in solvents may be an ordinary method. Specifically, this may be performed by stirring using a stirring bar and magnetic stirrer, high speed homogenizer, disperser, planetary stirrer, twin-screw stirrer, ball mill, triple roll, etc. Further, the ingredients may also be dissolved or dispersed in a solvent, then for example filtered using a filter with a pore size of 0.1 μm or so etc.

(Gate Insulating Film)

Next, the gate insulating film of one embodiment of the present invention will be explained. The gate insulating film of one embodiment of the present invention is comprised of the above-mentioned resin composition of one embodiment of the present invention and is usually used for a thin film transistor.

Below, the gate insulating film of one embodiment of the present invention will be explained illustrating the case of application to a bottom gate type thin film transistor. Here, FIG. 1 is a cross-sectional view of a bottom gate type thin film transistor 1 as an example of a thin film transistor to which the gate insulating film of one embodiment of the present invention is applied. The thin film transistor to which the gate insulating film of the embodiment of the present invention is applied is not limited in any way to a thin film transistor which has the structure which is shown in FIG. 1.

As shown in FIG. 1, the bottom gate type thin film transistor 1 used as one example of a thin film transistor to which the gate insulating film of the embodiment of the present invention is applied is comprised of a substrate 2 on which a gate electrode 3, gate insulating film 4 comprised of the above-mentioned resin composition of one embodiment of the present invention, semiconductor layer 5, source electrode 6, drain electrode 7, and protective layer 8 are provided. Note that, in FIG. 1, a single thin film transistor 1 is shown, but the substrate 2 may also be configured with a plurality of thin film transistors 1 formed on them (for example, an activate matrix substrate etc.)

The substrate 2 is not particularly limited, but a flexible substrate comprised of polycarbonate, polyimide, polyethylene terephthalate, an alicyclic olefin polymer, or other flexible plastic, quartz, soda glass, inorganic alkali glass, or other glass substrate, silicon wafer, or other silicon substrate, etc. may be mentioned.

The gate electrode 3 is formed by a conductive material. As the conductive material, for example, platinum, gold, silver, nickel, chromium, copper, iron, tin, antimonial lead, tantalum, indium, palladium, tellurium, rhenium, iridium, aluminum, ruthenium, germanium, molybdenum, tungsten, tin oxide-antimony, iridium tin oxide (ITO), fluorine-doped zinc oxide, zinc, carbon, graphite, glassy carbon, silver paste, carbon paste, lithium, beryllium, magnesium, potassium, calcium, scandium, titanium, manganese, zirconium, gallium, niobium, sodium, sodium-potassium alloy, magnesium/copper mixture, magnesium/silver mixture, magnesium/aluminum mixture, magnesium/indium mixture, aluminum/aluminum oxide mixture, lithium/aluminum mixture, etc. may be mentioned. Further, a known conductive polymer which is doped etc. to improve its conductivity, for example, conductive polyaniline, conductive polypyrrol, conductive polythiophene (complex of polyethylenedioxythiophene and polystyrene sulfonic acid etc.) may be mentioned.

The gate insulating film 4 is comprised of the above-mentioned resin composition of one embodiment of the present invention. It is formed by coating the above-mentioned resin composition of one embodiment of the present invention on a substrate 2 on which a gate electrode 3 is formed by a predetermined pattern, removing the solvent if necessary, then curing.

The semiconductor layer 5 is a layer which is comprised of an amorphous silicon semiconductor, organic semiconductor, or amorphous oxide semiconductor. Among these, from the viewpoint of being able to improve the action and effect of one embodiment of the present invention more, a layer which is comprised of an amorphous oxide semiconductor is particularly preferable. When making the semiconductor layer 5 a layer which is comprised of an organic semiconductor, for example, a pentacene or polythiophene derivative, polyphenylene vinylene derivative, polythienylene vinylene derivative, polyallylamine derivative, polyacetylene derivative, acene derivative, oligothiophene, or other such organic semiconductor material can be used. Further, when making the semiconductor layer 5 a layer which is comprised of an amorphous oxide semiconductor, it may be made a sputtered film which is comprised of an amorphous oxide semiconductor which contains at least one type of element from among in, Ga, and Zn. The amorphous oxide semiconductor may be one which includes at least one type of element from among In, Ga, and Zn, but, for example, zinc oxide (ZnO), indium zinc oxide (IZO), zinc tin oxide (ZTO), aluminum zinc oxide (AZO), gallium zinc oxide (GZO), indium gallium zinc oxide (IGZO), etc. may be mentioned.

The source electrode 6 and drain electrode 7 are formed by a conductive material. As the conductive material, one similar to the above-mentioned gate electrode 3 can be used.

The protective layer 8 is a layer which covers the exposed surfaces of the components such as the substrate 2, gate electrode 3, gate insulating film 4, semiconductor layer 5, source electrode 6, and drain electrode 7 for protecting them. As the material which forms the protective layer 8, $SiO_2$, $SiON_x$, $SiN_x$, $Al_2O_3$, or other inorganic films and organic films which are comprised of acrylic, polyimide, cycloolefin, epoxy, novolac, or other various types of resin may be mentioned. Note that, the protective layer 8 may be a single layer or multiple layers. Further, the thin film transistor 1 according to the present embodiment was configured provided with the protective layer 8, but it need not be provided.

Next, the method of production of the thin film transistor 1 which is shown in FIG. 1 in the case where using a semiconductor layer 5 constituted by an amorphous oxide semiconductor will be explained. FIGS. 2A to 2D are a view which shows a process of production of a thin film transistor 1.

Figure 2A:
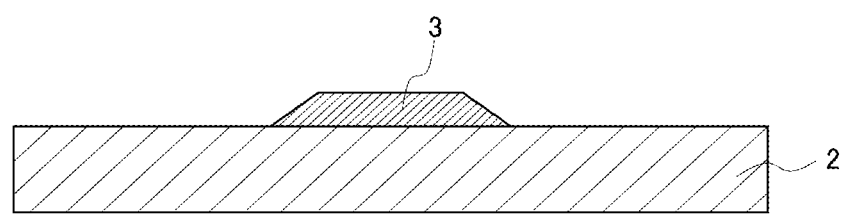
FIGS. 2A to 2D are a view which shows a method of production of a thin film transistor shown in FIG. 1.

First, the substrate 2 is formed with a layer which is comprised of a conductive material for forming a gate electrode 3 by the sputtering method etc. Next, the photolithography method is used to form a resist pattern (not shown), the resist pattern is used as a mask to etch the layer which is comprised of the conductive material by the wet etching method, then the resist pattern is removed to form the gate electrode 3 on the substrate 2 as shown in FIG. 2A.

Figure 2B:
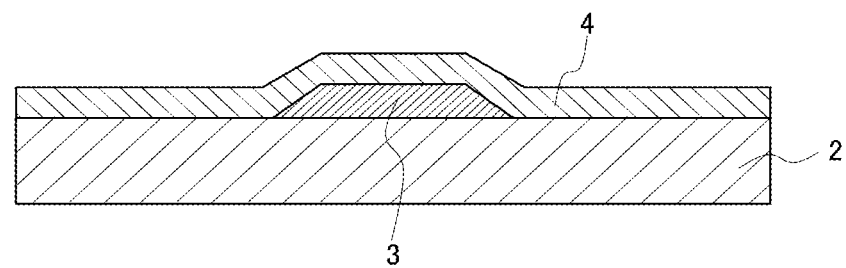

Next, as shown in FIG. 2B, the substrate 2 which is formed with the gate electrode 3 is coated with the resin composition of one embodiment of the present invention, the solvent is removed in accordance with need, then the resin is cured to form the gate insulating film 4. As the method of coating the resin composition of one embodiment of the present invention, for example, the spray method, spin coat method, roll coat method, die coat method, doctor blade method, rotating coat method, bar coat method, screen print method, and other various types of methods can be employed. Further, the curing temperature (cross-linking temperature) is usually 100 to 300° C., preferably 100 to 250° C., more preferably 100 to 230° C., while the curing time is usually 0.5 to 300 minutes, preferably 1 to 150 minutes, more preferably 1 to 60 minutes. The thickness of the gate insulating film 4 is not particularly limited, but is preferably 100 to 2000 nm, more preferably 100 to 1000 nm, furthermore preferably 100 to 500 nm.

Figure 2C:
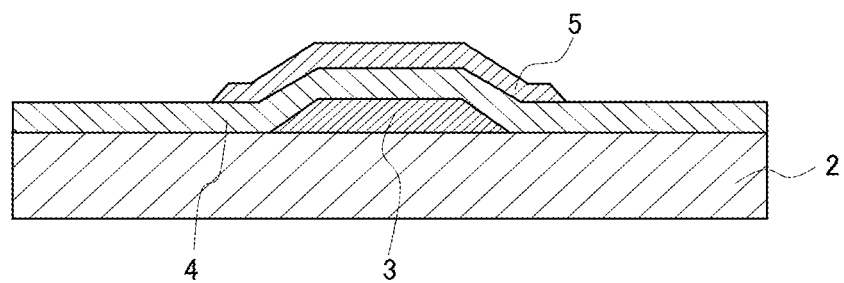

Next, as shown in FIG. 2C, on the gate insulating film 4 of the substrate 2 on which the gate electrode 3 and gate insulating film 4 are formed, a semiconductor layer 5 is formed. Specifically, first, on the gate insulating film 4, the sputtering method is used to form a layer which is comprised of an amorphous oxide semiconductor which contains at least one element among In, Ga, and Zn (below, referred to as the "amorphous oxide semiconductor layer") over the entire surface of the gate insulating film 4. When, for example, the semiconductor layer 5 is formed by iridium gallium zinc oxide (IGZO), the amorphous oxide semiconductor layer is formed using a target obtained by mixing and sintering indium oxide ($In_2O_3$), oxide ($Ga_2O_3$), and zinc oxide (ZnO) in equal moles by the DC (direct current) sputtering method. Note that, the sputtering can be performed by introducing argon (Ar) gas with a flow rate of 100 to 300 sccm and oxygen ($O_2$) gas with a flow rate of 5 to 20 sccm into the chamber. Further, the temperature of the substrate at this time is made 150 to 400° C. Note that, after forming the amorphous oxide semiconductor layer, the layer may be annealed in a 200 to 500° C. air atmosphere for 1 to 2 hours or so. Next, the thus formed amorphous oxide semiconductor layer is formed with a predetermined resist pattern on its surface, the resist pattern is used as a mask to etch the amorphous oxide semiconductor layer by the dry etching method, then the resist pattern is removed to thereby, as shown in FIG. 2C, form a semiconductor layer 5 on the gate insulating film 4.

Figure 2D:
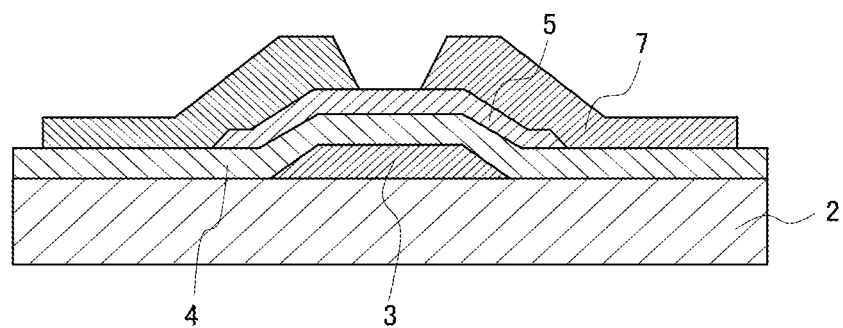

Next, as shown in FIG. 2D, on the gate insulating film 4 and semiconductor layer 5, a source electrode 6 and drain electrode 7 are formed. Specifically, first, the sputtering method is used to form over the entire surface of the top surface of the substrate 2, gate insulating film 4, and semiconductor layer 5 a layer which is comprised of a different conductive material which forms the source electrode 6 and drain electrode 7. Next, on the formed layer which is comprised of a conductive material, the photolithography method is used to form a resist pattern corresponding to the shapes of the source electrode 6 and drain electrode 7. Further, the formed resist pattern is used as a mask for etching the layer which is comprised of the conductive material by the dry etching method, then the resist pattern is removed to form the source electrode 6 and drain electrode 7 such as shown in FIG. 2D.

Next, a protective layer (passivation film) 8 is formed so as to cover the entire top surfaces (exposed surfaces) of the gate insulating film 4, semiconductor layer 5, source electrode 6, and drain electrode 7 and thereby produce the bottom gate type (channel etch-type) thin film transistor 1 such as shown in FIG. 1. The protective layer 8 can be formed using the above materials etc. by, for example, the plasma CVD method etc. In the above way, a bottom gate type thin film transistor 1 which is shown in FIG. 1 is produced.

In one embodiment of the present invention, the gate insulating film which is used for Such a bottom gate type thin film transistor 1 or other electronic component is formed by the above-mentioned resin composition of one embodiment of the present invention. The resin composition contains a hydroxyl group-cyanoalkyl group-containing resin (A), epoxy compound (B), curing agent (C), and cross-linking agent (D) and can give a resin film which is high in dielectric constant, excellent in chemical resistance and adhesion, and further is suitably prevented from dropping in adhesion when treated at a high temperature after film formation. For this reason, according to one embodiment of the present invention, by forming the gate insulating film 4 of the thin film transistor 1 which is shown in FIG. 1 by using the resin composition of one embodiment of the present invention, due to its excellent chemical resistance, it is possible to effectively prevent a change in film thickness caused by deterioration even when exposed to a developing solution or etching solution when forming a semiconductor layer 5, source electrode 6 or drain electrode 7 on the gate insulating film 4. In addition, according to one embodiment of the present invention, when forming the semiconductor layer 5, source electrode 6 or drain electrode 7, even when baking is performed at a relatively high temperature, the gate insulating film 4 which is comprised of the resin film which is obtained using the resin composition of the embodiment of the present invention is suitably prevented from dropping in adhesion at the time of high temperature treatment after film formation, so the drop in adhesion due to such baking can also be effectively prevented. In particular, the gate insulating film 4 which is obtained using the resin composition of one embodiment of the present invention in this way can effectively prevent a change in film thickness caused by deterioration and a drop in adhesion at the time of high temperature treatment after film formation while achieving a high dielectric constant, so, due to this, the obtained thin film transistor 1 or other electronic component can be raised in performance.

Figure 3:
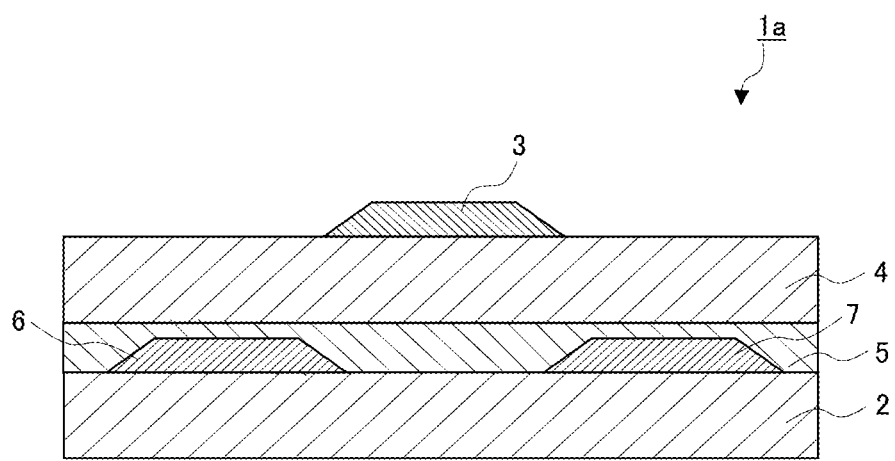
FIG. 3 is a cross-sectional view which shows another example (second example) of a thin film transistor which is provided with a gate insulating film comprised of the resin composition of an embodiment of the present invention.

Note that, in the above, the bottom gate type thin film transistor 1 which is shown in FIG. 1 is illustrated and explained, but the gate insulating film of one embodiment of the present invention is not limited to such a bottom gate type thin film transistor 1. It is also possible to suitably use as a gate insulating film of the top gate type thin film transistor 1a such as shown in FIG. 3 etc. and various electronic components. Here, FIG. 3 is a cross-sectional view of a top gate type thin film transistor 1a which is provided with a gate insulating film which is comprised of the resin composition of one embodiment of the present invention. Component members the same as the above-mentioned thin film transistor 1 are assigned the same reference notations and their explanations are omitted. Note that, the top gate type thin film transistor 1a shown in FIG. 3 has a substrate 2 and on it a source electrode 6, drain electrode 7, semiconductor layer 5, gate insulating film 4 comprised of the above-mentioned resin composition of one embodiment of the present invention, and gate electrode 3.

Figure 4:
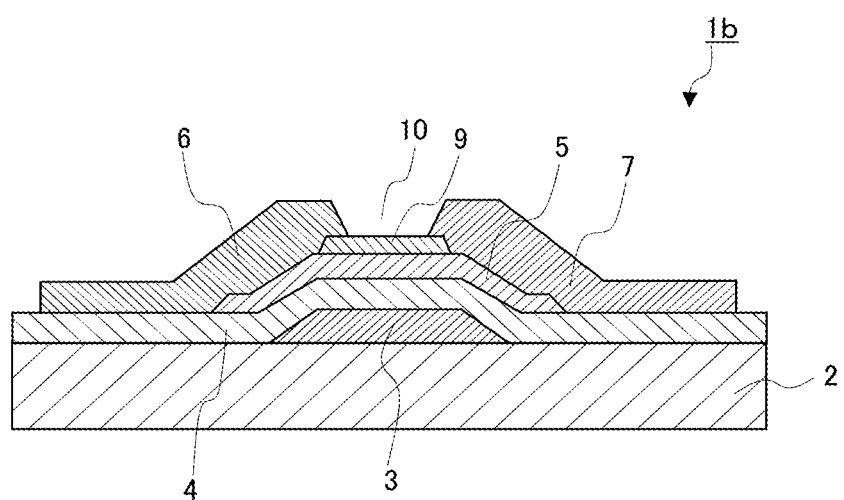
FIG. 4 is a cross-sectional view which shows another example (third example) of a thin film transistor which is provided with a gate insulating film comprised of the resin composition of an embodiment of the present invention.

Alternatively, the gate insulating film which is comprised of the resin composition of one embodiment of the present invention can also be suitably used as a gate insulating film of a thin film transistor 1b of an etch stop layer type such as shown in FIG. 4. Here, FIG. 4 is a cross-sectional view which shows an etch stop layer type thin-film transistor 1b which is provided with a gate insulating film which is comprised of the resin composition of one embodiment of the present invention. Component members the same as the above-mentioned thin film transistor 1 are assigned the same reference notations and their explanations are omitted. The thin film transistor 1b which is shown in FIG. 4 has a configuration similar to the thin film transistor 1 shown in the above-mentioned FIG. 1 except for the point of a channel part 10 being covered by the formation of an etch stopper 9. As shown in FIG. 4, this thin film transistor 1b is configured with the vicinities of the end parts of the semiconductor layer 5 and the vicinities of the end parts of the etch stopper 9 covered by a source electrode 6 and drain electrode 7 respectively provided there. Note that, in FIG. 4, an embodiment not formed with a protective film 8 is shown, but in the same way as the thin film transistor 1 shown in FIG. 1, a protective film 8 may be formed on the source electrode 6, drain electrode 7, and etch stopper 9.

EXAMPLES

Below, examples and comparative examples will be given to more specifically explain one embodiment of the present invention. In the examples, the "parts" and "I" are based on weight unless otherwise indicated.

Note that, the definitions and methods of evaluation of the different properties are as follows.

<Dielectric Constant>

Each of the resin compositions which were prepared in the examples and comparative examples was spin coated on a silicon wafer, then a hot plate was used for prebaking at 110° C. for 2 minutes to form a resin film. Next, this was additionally heated in nitrogen at 180° C. for 1 hour to obtain a resin film sample which is comprised of a 500 nm thickness resin film which is formed on a silicon wafer. Further, the obtained resin film sample was used in accordance with JIS C6481 at 10 kHz (room temperature) to measure the resin film for dielectric constant.

<Adhesion after Film Formation>

Each of the resin composition which was prepared in the examples and comparative examples was coated on a glass substrate, then a hot plate was used for prebaking at 110° C. for 2 minutes to form a resin film. Next, this was additionally heated in nitrogen at 180° C. for 1 hour to obtain a resin film-coated substrate on which a 2 μm thickness resin film was formed.

The adhesion test was performed by the surface and interfacial cutting analysis method (SAICAS method) which is explained below. That is, the resin film part of the above obtained resin film-coated substrate was formed with a cut of 1 mm width by a cutter. The cut resin film-coated substrate was cut using a blade constituted by a blade made of single crystal diamond with a 1.0 mm width, rake angle 20°, and relief angle 10° and by cutting the sample by a horizontal speed of 0.2 μm/sec and a vertical speed of 0.02 μm/sec, and measured the adhesion using an adhesion measuring device constituted by a Saicas DN-20 model made by Daipla Wintes. When the blade cut to the interface between the resin film and the glass substrate surface, the vertical speed was reduced to 0 μm/sec and the blade was made to move parallel to the substrate to measure the horizontal force FH (N). Further, the obtained horizontal force FH (N) and the blade width w (m) were used to calculate the peeling strength P in accordance with the formula "P[N/m]=FH[N]/w[m]". The obtained peeling strength P was used as the value of adhesion of the resin film and evaluated by the following criteria.

A: peeling strength P of 100 N/m or more
B: peeling strength P of SON/m to less than 100 N/m
C: peeling strength P of less than 80 N/m <Adhesion after Additional Baking>

In the same way as the evaluation of above-mentioned "adhesion after film formation", a resin film-coated substrate on which a 2 μm thickness resin film was formed was obtained and this obtained resin film-coated substrate was heated at 220° C. for 1 hour to obtain an additionally baked resin film-coated substrate. Further, except for using the obtained additionally baked resin film-coated substrate, in the same way as the evaluation of the above-mentioned "adhesion after film formation", the peeling strength P was found and the same criteria were used to evaluate the adhesion after the additional baking.

<Chemical Resistance>

In the same way as the evaluation of above-mentioned "adhesion after film formation", a resin film sample was obtained and the obtained resin film sample was dipped in acetone at 25° C. for 15 minutes to measure the rate of change of thickness of resin film before and after dipping and evaluate the chemical resistance. Note that, the rate of change of thickness of resin film before and after dipping was calculated in accordance with the "rate of change of thickness of resin film before and after dipping (%)=thickness of resin film after dipping-thickness of resin film before dipping)/thickness of resin film before dipping)×100". Further, the chemical resistance was evaluated by the following criteria.

A: rate of change of thickness of resin film before and after dipping of less than 10%

B: rate of change of thickness of resin film before and after dipping of 10% to less than 20%

C: rate of change of thickness of resin film before and after dipping of 20% or more Example 1

A hydroxyl group-cyanoalkyl group-containing resin (A) constituted by cyanoethylated pullulan (product name "Cyano Resin CR-S", made by ShinEtsu Chemical, hydroxyl groups:cyanoethyl groups=10:90 (molar ratio)) 100 parts, an epoxy compound (B) constituted by tetrakis (glycidyloxyphenyl)ethane (product name "jER1031S", made by Mitsubishi Chemical Corporation) 20 parts, a curing agent (C) constituted by a phenol aralkyl-type resin (product name "KAYAHARD GPH-65", made by Nippon Kayaku, hydroxyl value: 175 mgKOH/g) 10 parts, a cross-linking agent (D) constituted by the compound which is shown by the above formula (9) (product name "Nikalac MX-270", made by Sanwa Chemical) 5 parts, a phenol compound (E) constituted by a novolac-type phenol resin (product name "PAPS-PN4", made by Asahi Organic Chemical Industry, hydroxyl value: 104 mgKOH/g) 10 parts, a curing catalyst (F) constituted by a $PF_6^-$ based sulfonium salt (product name "San-aid SI-110L", made by Sanshin Chemical Industry) 2 parts, 3-glycidoxypropyl trimethoxysilane (product name "Z6040", made by Toray-Dow Corning, silane coupling agent) 1 part, a solvent constituted by γ-butyrolactone 60 parts, and propyleneglycol monomethyl ether acetate 40 parts were mixed and made to dissolve, then were filtered by a pore size 0.2 μm polytetrafluoroethylene filter to prepare a resin composition.

Further, the above obtained resin composition was used in accordance with the above-mentioned methods to perform the tests and evaluations of the dielectric constant, adhesion after film formation, adhesion after additional baking, and chemical resistance. The results are shown in Table 1.

Examples 2 to 9

When preparing the resin compositions, except for using the compounds which are shown in Table 1 in the amounts which are shown in Table 1, the same procedures were followed as in Example 1 to prepare resin compositions and the same procedures were used to test and evaluate them. The results are shown in Table 1.

Comparative Examples 1 to 4

When preparing the resin compositions, except for using the compounds which are shown in Table 1 in the amounts which are shown in Table 1, the same procedures were followed as in Example 1 to prepare resin compositions and the same procedures were used to test and evaluate them. The results are shown in Table 1.

Note that, in Table 1, the compounds were as follows.

"Cyanoethylated polyvinyl alcohol" is cyanoethylated polyvinyl alcohol (product name "Cyanoresin CR-V", made by Shin-Etsu Chemical, hydroxyl groups:cyanoethyl groups=15:85 (molar ratio), hydroxyl group-cyanoalkyl group-containing resin (A))

"Polyvinyl phenol" is polyvinyl phenol (product name "Marukalinker MS4P", made by Maruzen Petrochemical, resin containing hydroxyl groups, but not containing cyanoalkyl groups)

"Epoxy compound (Epiclon HP4700)" is an epoxy compound which has a naphthalene structure (product name "Epiclon HP4700", made by DIC, epoxy compound (B))

"Epoxy compound (NC-6000)" is 2-[4-(2,3-epoxy propoxy)phenyl]-2-[4-[1,1-bis[4-([2,3-epoxypropoxy]phenyl)ethyl]phenyl]propane (product name "NC-6000", made by Nippon Kayaku, epoxy compound (B))

"Epoxy compound (jERYX8800)" is anthracene dehydride-type epoxy resin (product name "jERYX8800", made by Mitsubishi Chemical, epoxy compound (B))

"Curing agent (MEH-7800)" is a phenol-aralkyl-type resin (product name "MEH-7800", made by Meiwa Plastics Industries, curing agent (C), hydroxyl value: 175 mgKOH/g)

"Curing agent (MEH-7851)" is a phenol-biphenylene-type resin (product name "MEH-7851", made by Meiwa Plastics Industries, curing agent (C), hydroxyl value: 220 mgKOH/g)

"Cross-linking agent of formula (7) (Nikalac MX280)" is a compound shown by the above formula (7) (product name "Nikalac MX280", made by Sanwa Chemical, cross-linking agent (D))

"Melamine-based cross-linking agent (Cylink 2000)" is a melamine-based cross-linking agent (product name "Cylink 2000", made by Cytech Industries, melamine-based cross-linking agent)

"Melamine-based cross-linking agent (Cymel 350)" is a melamine-based cross-linking agent (product name "Cymel 350", made by Cytech Industries, melamine-based cross-linking agent)

TABLE 1

| | | Examples | | | | | | | | | | | Comparative Examples | | | |
|---|---|---|---|---|---|---|---|---|---|---|---|---|---|---|---|---|
| | | 1 | 2 | 3 | 4 | 5 | 6 | 7 | 8 | 9 | 10 | 11 | 1 | 2 | 3 | 4 |
| Composition of resin composition | | | | | | | | | | | | | | | | |
| Cyanoethylated pullulan | (parts) | 100 | 100 | 100 | 100 | 100 | 100 | 100 | 100 | | 100 | 100 | 100 | 100 | 100 | |
| Cyanoethylated polyvinyl alcohol | (parts) | | | | | | | | | 100 | | | | | | |
| Polyvinyl phenol | (parts) | | | | | | | | | | | | | | | 100 |
| Epoxy compound (jER1031S) | (parts) | 20 | 20 | 20 | 20 | | | | | | | | 20 | 20 | 20 | |
| Epoxy compound (Epiclon HP4700) | (parts) | | | | | 20 | | | | 20 | 20 | 20 | | | | 20 |
| Epoxy compound (NC-6000) | (parts) | | | | | | 20 | 20 | | | | | | | | |
| Epoxy compound (jERYX8800) | (parts) | | | | | | | | 20 | | | | | | | |
| Curing agent (GPH-65) (hydroxyl group value: 199 mgKOH/g) | (parts) | 10 | 10 | 20 | 20 | | 10 | | 10 | 10 | | 10 | 10 | | | 10 |
| Curing agent (MEH-7800) (hydroxyl group value: 175 mgKOH/g) | (parts) | | | | | 20 | | 10 | | | | | | | | |
| Curing agent (MEH-7851) (hydroxyl group value: 220 mgKOH/g) | (parts) | | | | | | | | | | 10 | | | | | |
| Cross-linking agent expressed by formula (9) (Nikalac MX270) | (parts) | 5 | 10 | 5 | 10 | 5 | 10 | | | 10 | 10 | 10 | | | 5 | |
| Cross-linking agent expressed by formula (7) (Nikalac MX280) | (parts) | | | | | | | 10 | 10 | | | | | | | |
| Melamine-based cross-linking agent (Cylink 2000) | (parts) | | | | | | | | | | | | 5 | | | 10 |
| Melamine-based cross-linking agent (Cymel 350) | (parts) | | | | | | | | | | | | | 5 | | |
| Phenol compound (PAPS-PN4) (hydroxyl group value: 104 mgKOH/g) | (parts) | 10 | 10 | | | | 5 | 5 | | 10 | 10 | 10 | 10 | 20 | 20 | |
| $PF_6^-$ based sulfonium salt-based curing catalyst (SI-110L) | (parts) | 2 | 2 | 2 | 2 | 2 | 2 | 2 | 2 | 2 | 2 | 2 | 2 | 2 | 2 | 2 |
| Silane coupling agent (Z6040) | (parts) | 1 | 1 | 1 | 1 | 1 | 1 | 1 | 1 | 1 | 1 | 1 | 1 | 1 | 1 | 1 |
| Evaluation | | | | | | | | | | | | | | | | |
| Dielectric constant | | A | A | A | A | A | A | A | A | A | A | A | A | A | A | C |
| Adhesion after film formation (after curing at 180° C.) | | A | A | A | A | A | A | A | A | A | A | A | A | C | B | A |
| Adhesion after additional baking (after additional baking at 220° C.) | | A | A | A | A | A | A | A | B | A | A | A | C | C | C | C |
| Chemical resistance | | A | A | B | B | A | A | A | A | B | A | B | A | A | A | A |

As shown in Table 1, all of the resin films comprised of a resin composition of one embodiment of the present invention which contains a hydroxyl group-cyanoalkyl group-containing resin (A), epoxy compound (B), curing agent (C), and cross-linking agent (D) which has the structure of the above general formula (1) are high in dielectric constant, excellent in chemical resistance, adhesion after formation, and adhesion after additional baking, and suitable for applications of gate insulating films of various electronic components, in particular are suitable for applications for gate insulating films of bottom gate type thin film transistors (Examples 1 to 11).

On the other hand, when using, instead of the cross-linking agent (D) which has the structure represented by the above general formula (1), a melamine-based cross-linking agent, the obtained resin film became inferior in adhesion after additional baking (Comparative Examples 1 and 2).

Further, even when not mixing in a curing agent (C), the obtained resin film became inferior in adhesion after additional baking (Comparative Example 3).

Furthermore, when using, instead of the hydroxyl group-cyanoalkyl group-containing resin (A), polyvinyl phenol (resin containing hydroxyl groups, while not containing cyanoalkyl groups), the obtained resin film becomes lower in dielectric constant and becomes inferior in adhesion after additional baking (Comparative Example 4).

REFERENCE SIGNS LIST 1, 1a: thin film transistor
2: substrate
3: gate electrode
4: gate insulating film
5: semiconductor layer
6: source electrode
7: drain electrode
8: protective layer

The invention claimed is:
1. A resin composition comprising:
a resin (A) containing a hydroxyl group and a cyanoalkyl group;
an epoxy compound (B) having two or more epoxy groups in its molecule;
a curing agent (C) having two or more hydroxyl groups in its molecule and having a hydroxyl value of 150 to 300 mgKOH/g; and
a cross-linking agent (D) having a structure represented by the following general formula (1),
wherein, in the general formula (1), $R^1$ and $R^2$ are $C_1$ to $C_{20}$ alkyl groups, where $R^1$ and $R^2$ are the same as each other or different from each other:

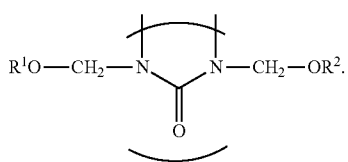
(1)

2. The resin composition according to claim 1, wherein the resin (A) is one obtained by cyanoalkylating part of the hydroxyl groups contained in a hydroxyl group-containing organic compound.

3. The resin composition according to claim 2, wherein the hydroxyl group-containing organic compound is pullulan or a polyvinyl alcohol.

4. The resin composition according to claim 1, wherein the epoxy compound (B) is an aromatic hydrocarbon structure-containing epoxy compound having two or more epoxy groups in its molecule.

5. The resin composition according to claim 1, wherein the curing agent (C) has phenolic hydroxyl groups as the hydroxyl groups.

6. The resin composition according to claim 1, further comprising a phenol compound (E) having a phenolic hydroxyl group in its molecule and having a hydroxyl value of less than 150 mgKOH/g.

7. The resin composition according to claim 1, further comprising a curing catalyst (F).

8. The resin composition according to claim 1, wherein a ratio of the hydroxyl group and the cyanoalkyl group which are contained in the resin (A) is, by molar ratio of "hydroxyl group:cyanoalkyl group", 50:50 to 2:98.

9. The resin composition according to claim 1, wherein the cross-linking agent (D) is at least one type of compound represented by the following general formulas (2) to (4), wherein
$R^1$ and $R^2$ in the general formulas (2) to (4) are the same as in the general formula (1),
$R^3$ and $R^4$ in the general formula (3) are $C_1$ to $C_{20}$ alkyl groups, and all or any of $R^1$, $R^2$, $R^3$, and $R^4$ in the general formula (3) are the same as each other or different from each other:

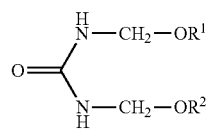
(2)

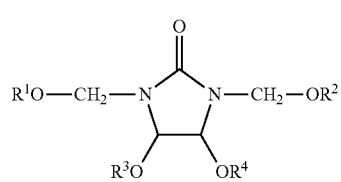
(3)

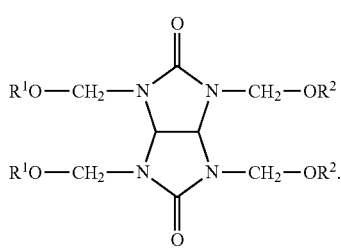
(4)

10. A gate insulating film obtained using a resin composition according to claim 1.

11. The resin composition according to claim 1, wherein the cross-linking agent (D) is represented by any one of the following formulas (5) to (10):

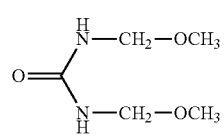
(5)

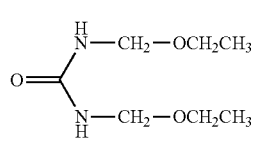
(6)

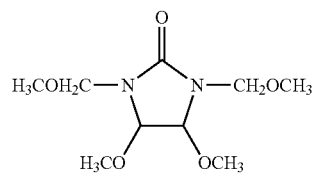
(7)

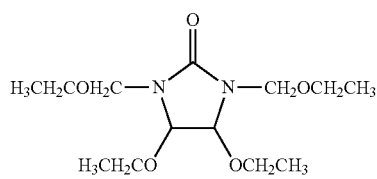
(8)

-continued
(9)
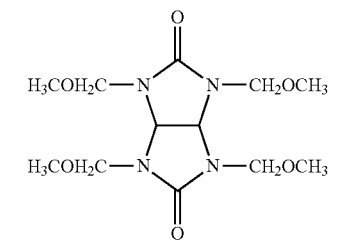
(10)
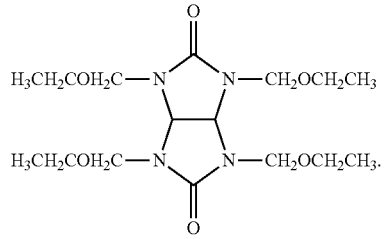
* * * * *